US012015401B2

(12) United States Patent
Forster (10) Patent No.: US 12,015,401 B2
(45) Date of Patent: Jun. 18, 2024

(54) METHOD FOR ACTUATING AN OPERATING DEVICE, WHEREIN AT LEAST ONE CORRECTION VALUE IS DETERMINED, OPERATING DEVICE AND DOMESTIC APPLIANCE

(71) Applicant: BSH Hausgeräte GmbH, Munich (DE)

(72) Inventor: Florian Forster, Bergen (DE)

(73) Assignee: BSH Hausgeräte GmbH, Munich (DE)

( * ) Notice: Subject to any disclaimer, the term of this patent is extended or adjusted under 35 U.S.C. 154(b) by 815 days.

(21) Appl. No.: 16/973,442

(22) PCT Filed: May 29, 2019

(86) PCT No.: PCT/EP2019/063912
§ 371 (c)(1),
(2) Date: Dec. 9, 2020

(87) PCT Pub. No.: WO2019/238422
PCT Pub. Date: Dec. 19, 2019

(65) Prior Publication Data
US 2021/0250023 A1 Aug. 12, 2021

(30) Foreign Application Priority Data
Jun. 14, 2018 (DE) ...................... 10 2018 209 515.9

(51) Int. Cl.
*H03K 17/975* (2006.01)
*F24C 3/12* (2006.01)
(Continued)

(52) U.S. Cl.
CPC .......... *H03K 17/975* (2013.01); *F24C 3/124* (2013.01); *G01B 7/30* (2013.01); *G01D 5/2415* (2013.01);
(Continued)

(58) Field of Classification Search
CPC ........ H03K 17/975; H03K 2217/94073; F24C 3/124; G01D 5/241; G01D 5/2412;
(Continued)

(56) References Cited

U.S. PATENT DOCUMENTS 8,264,242 B2 * 9/2012 Toyota ................. G01D 5/2405
324/662
2005/0052429 A1 * 3/2005 Philipp ............... G06F 3/03547
345/173
(Continued)

FOREIGN PATENT DOCUMENTS

FR 3056475 A1 3/2018

OTHER PUBLICATIONS

International Search Report PCT/EP2019/Q63912 dated Aug. 20, 2019.

Primary Examiner — Steven L Yeninas
(74) Attorney, Agent, or Firm — Michael E. Tschupp; Andre Pallapies; Brandon G. Braun (57) ABSTRACT

In a method for operating an operating device for a household appliance, an operating element of the operating device is actuated with a first actuation type from a first resting position to a first operating position to set a first function of the household appliance. A setting parameter of a second function of the household appliance is set by actuating the operating element with a second type of actuation different from the first type of actuation from a second resting position into at least one of a plurality of intermediate positions of the operating element. The first function of the household appliance is actuated in response to a sensing of a first capacitance value of the operating device, and a second capacitance value is sensed while taking into account (Continued)

a correction value in dependence on the sensed first capacitance value for determining the setting parameter of the second function.

27 Claims, 4 Drawing Sheets

(51) Int. Cl.
    *G01B 7/30*     (2006.01)
    *G01D 5/241*     (2006.01)
    *G05G 5/05*     (2006.01)
    *G05G 9/02*     (2006.01)

(52) U.S. Cl.
    CPC .................. *G05G 5/05* (2013.01); *G05G 9/02* (2013.01); *G05G 2505/00* (2013.01); *H03K 2217/94073* (2013.01)

(58) Field of Classification Search
    CPC ...... G01D 5/2415; G01D 5/2417; G05G 5/05; G05G 9/02; G05G 2505/00; H01H 25/008; H01H 25/065
    See application file for complete search history.

(56) References Cited

U.S. PATENT DOCUMENTS

| | | | |
|---|---|---|---|
| 2007/0181410 A1* | 8/2007 | Baier | F24C 7/082 |
| | | | 200/17 R |
| 2008/0024455 A1* | 1/2008 | Lee | G06F 3/044 |
| | | | 345/173 |
| 2013/0229339 A1* | 9/2013 | Takahata | G06F 3/0362 |
| | | | 345/156 |
| 2016/0097657 A1* | 4/2016 | Borgiani | G01D 5/2415 |
| | | | 324/686 |
| 2018/0084937 A1* | 3/2018 | Joo | F24C 7/082 |
| 2018/0091144 A1* | 3/2018 | Kwon | H01R 43/20 |
| 2021/0191574 A1* | 6/2021 | Sleeman | G06F 3/0447 |

\* cited by examiner

METHOD FOR ACTUATING AN OPERATING DEVICE, WHEREIN AT LEAST ONE CORRECTION VALUE IS DETERMINED, OPERATING DEVICE AND DOMESTIC APPLIANCE

CROSS-REFERENCES TO RELATED APPLICATIONS

This application is the U.S. National Stage of International Application No. PCT/EP2019/063912, filed May 29, 2019, which designated the United States and has been published as International Publication No. WO 2019/238422 A1 and which claims the priority of German Patent Application, Serial No. 10 2018 209 515.9, filed Jun. 14, 2018, pursuant to 35 U.S.C. 119(a)-(d).

BACKGROUND OF THE INVENTION

The invention relates to a method for actuating an operating device for a household appliance. By means of an operating element of the operating device, a first function of the household appliance is set by actuating the operating element with a first actuation type from a first resting position into a first operating position. For setting a value, a setting parameter of a second function of the household appliance is set by actuating the operating element with a second actuation type which is different from the first actuation type, from a second resting position of the operating element into at least one of a plurality of intermediate positions of the operating element. In order to actuate the first function of the household appliance, at least one first capacitance value of the operating device is sensed by means of a capacitive sensing apparatus of the operating device and, in order to determine the setting parameter, at least one second capacitance value is sensed by means of the capacitive sensing apparatus. The invention further relates to an operating device and a household appliance.

Operating devices by means of which a first function and a second function of the household appliance may be actuated by a first actuation type and a second actuation type are already known from the prior art.

For example, EP 3 002 562 A1 discloses an operating device having a capacitive sensing apparatus which has a printed circuit board and a plurality of conductive sectors which generate capacitances. Moreover, the operating device has a rotor which is mounted relative to the printed circuit board in the rotational and/or axial displacement mode, wherein the rotor is produced from a dielectric material and has a peripheral slot which is arranged in registers with the conductive sectors. Moreover, the operating device has a control unit which is electrically connected to the conductive sectors in such a manner as to sense the capacitance of each capacitor which is produced by the conductive sectors. The control unit is set such that it senses the capacitance change between the capacitors during the rotation and/or axial displacement of the rotor, in order to sense the angular and/or axial position of the rotor.

A drawback in the known operating device, however, is that disturbance variables, such as for example leakage currents and/or temperature drift and/or ageing and/or production tolerances and/or mounting tolerances and/or component tolerances, influence the sensing of the capacitances, which may significantly falsify the results and may cause considerable errors when determining an angle of the operating element. The influence of these disturbance variables on the capacitance measurement is not able to be avoided with reasonable effort and a digital correction is required. The determination of the correction parameters, however, is not possible in the static state without previous knowledge of the rotational angle, which results in limitations in the reliability of the angle to be determined.

BRIEF SUMMARY OF THE INVENTION

It is the object of the present invention to provide a method, an operating device and a household appliance, by means of which a more reliable actuation of the operating device may be implemented.

This object is achieved by a method, an operating device and a household appliance as claimed in the independent claims.

One feature of the invention relates to a method for actuating an operating device for a household appliance. By means of an operating element of the operating device, a first function of the household appliance is set by actuating the operating element with a first actuation type from a first resting position into a first operating position. For setting a value, a setting parameter of a second function of the household appliance is set by actuating the operating element with a second actuation type which is different from the first actuation type, from a second resting position of the operating element into at least one of a plurality of intermediate positions of the operating element. In order to actuate the first function of the household appliance, at least one first capacitance value of the operating device is sensed by means of a capacitive sensing apparatus of the operating device and, in order to determine the setting parameter, at least one second capacitance value is sensed by means of the capacitive sensing apparatus.

It is provided that in the case of the first actuation type, from the first resting position into the first operating position, the first capacitance value is sensed and at least one correction value is determined in dependence on the sensed first capacitance value, which correction value is taken into account in the determination of the second capacitance value in order to determine the setting parameter of the second function.

As a result, a reliable correction of the second capacitance value and thus a reliable actuation of the operating device, in particular relative to the second actuation type, may be possible. Thus a currently valid correction value may be determined so that the second capacitance value may be reliably determined and adapted to the current situation. As a result, the disruptive influence of the disturbance variables mentioned in the introduction may be minimized and/or compensated so that a reliable angular sensing of the operating element is possible.

In particular, it may be provided that a plurality of correction values, which in particular corresponds to more than one, is determined for the operating device.

Preferably it is provided that the operating device is configured as a burner control knob. In particular, the operating element in the second actuation type, in particular when rotated, has a plurality of possible intermediate positions. Relative to the second actuation type, these intermediate positions may be between the second resting position and an end position. The intermediate positions may be set, in particular, steplessly. A non-stepless setting is also possible. In particular, the setting parameter is set in a variable manner in the different intermediate positions. In particular, a current power level may be controlled by means of the setting parameter. In particular, as a result, the power level may be displayed in a reliable and accurate manner on a display apparatus of the household appliance or the operating device. It is also possible that in an operating device for a gas hob, the gas flow is set in a variable manner in the different intermediate positions.

According to an advantageous embodiment, as the first actuation type of the operating element, the operating element is pushed along an axis of the operating element and, as the second actuation type, the operating element is rotated about the axis. As a result, a push-rotate operating device may be implemented. As a result, two different actuation types may be implemented. This leads to increased functionality and to a reliable operation since in particular the two actuation types are configured differently in terms of their actuation type and may be differentiated easily relative to changes in capacitance value. In particular, due to the high level of distinctiveness of the actuation types, the first capacitance value and the second capacitance value may be reliably sensed, without it resulting in misinterpretations of the respective capacitance values. As a result, a reliable operation of the operating device is possible.

It has also proved advantageous if, after the actuation by means of the first actuation type of the operating element from the resting position into the first operating position, the operating element is restored automatically into the first resting position by means of a restoring apparatus of the operating device. In particular, the restoring apparatus may be configured as a spring and thus the operating element may be reset by means of a spring force into the first resting position. As a result, a reliable operation of the operating device is implemented since the operating element may be reliably returned into the first resting position.

It is also advantageous if the actuation of the operating element with the first actuation type takes place chronologically before the actuation of the operating element with the second actuation type, and the operating element is pushed from the same resting position of the first actuation type from which the operating element is actuated from the resting position of the second actuation type, so that the first resting position corresponds to the second resting position. As a result, a reliable sensing of the capacitance values is possible. In particular, as a result, it is possible that after actuation with the first actuation type a direct actuation with the second actuation type is possible. Thus the second function of the household appliance may be set directly after the actuation of the first function. For example, in the embodiment of the operating device as a burner control knob an ignition of the burner may be triggered by means of the first function. The ignition of the burner is required and takes place, in particular, before the second function of the household appliance. In particular, a current power level may be controlled by means of the setting parameter. In particular, as a result, the power level may be reliably and accurately displayed on a display apparatus of the household appliance or of the operating device. Moreover, the gas flow may be set in the different intermediate positions by the actuation of the operating element.

In other words, in an embodiment as a burner control knob the burner control knob is pushed in order to generate ignition before the start of the cooking process of the food. In particular, this may be utilized in order to determine the corresponding correction value for the second capacitance value which may serve for setting the gas. In particular, before the burner control knob is pushed, a sensing of the angle is not required since at this time the burner control knob is in any case in the first resting position due to the mechanical design thereof. In particular, by returning into this resting position and the subsequent rotation from this resting position, therefore, the gas may be set for the household appliance. As a result, it is possible that a sensing of the rotational angle of the operating element may be reliably achieved, resulting in a reliable actuation of the operating device.

In one advantageous embodiment, the capacitive sensing apparatus may have at least one rotor with at least one rotor sensor element and a stator with at least two stator sensor elements, wherein at least the first and the second capacitance value are generated in dependence on a positional change of the rotor sensor element relative to the stator sensor elements. As a result, a reliable capacitance value sensing is possible. In particular, the first capacitance value and the second capacitance value and possibly further capacitance values may thus be reliably sensed in dependence on the positional change of the respective sensor elements to one another. By means of this embodiment, therefore, a reliable sensing of the capacitance values may be carried out, resulting in a reliable actuation of the operating device. In particular, it may be provided that the stator has a plurality of stator sensor elements, in particular three, in particular more than three, in particular twelve. As a result, a positionally accurate determination of the stator is possible.

It is also advantageous if one respective correction value is determined for one respective stator sensor element and the respective correction value of one respective stator sensor element is taken into account in the determination of the second capacitance value. In other words, an individual correction value is determined for each stator sensor element. In other words, a single measuring error of each stator sensor element is sensed by the correction value. By determining one respective correction value of each stator sensor element, in particular, it is possible that the second capacitance value may be reliably corrected and determined. As a result, a reliable determination of the position of the operating element is possible, resulting in a reliable actuation of the operating device.

It is also advantageous if a relative angle of the stator to the rotor is determined in dependence on the second capacitance value and the setting parameter is set in dependence on the angle. In particular, the rotor sensor element has an aperture so that, due to the geometric shape of the rotor with the aperture, the angle of the rotor may be determined relative to the stator via the capacitance values. By the determination of the relative angle the setting parameter may be reliably determined, resulting in a reliable actuation of the operating device.

According to a further advantageous embodiment, the first and the second capacitance value may be determined by evaluating stator capacitance values of the at least two stator sensor elements. In particular, to this end the individual capacitances or the coupling capacitances of the stator sensor elements may be determined in each case. For example, for determining the individual capacitances each of the stator sensor elements may be grounded and the respective change in capacitance individually measured relative to the earth. For determining the coupling capacitances, in particular, the respective capacitances may be measured between the at least two stator sensor elements. As a result, a reliable determination of the first and the second capacitance value is possible. As a result, a reliable actuation of the operating device may be implemented.

In a further advantageous embodiment, the first capacitance value may be determined by adding up the respective stator capacitance values when actuated with the first actuation type. This is because the rotor covers a plurality of sensor elements and it is not known which sensor elements are currently covered. Thus the current correction value may be reliably determined, so that a reliable actuation of the operating device may be implemented.

It is also advantageous if, for determining the first capacitance value, temporal changes to the stator capacitance values are filtered as stator signals by means of a bandpass so that the first actuation type may be sensed. In particular, it is provided that the bandpass blocks slow temporal changes in the stator signal which are produced, for example, due to drift (for example in the case of temperature changes). The bandpass also blocks very rapid temporal changes to the stator signal since these are interference signals which may be produced, for example, by electromagnetic coupling from the outside. In particular, it may be provided that the bandpass is permeable to temporal changes in the stator signals which are produced by the first actuation type, in particular by pushing and releasing the operating element. As a result, a reliable identification of the first actuation type is possible, whereby the first capacitance value and the correction value determined therefrom may be reliably determined.

In a further advantageous embodiment, the stator signals of the stator capacitance value changes at a frequency of >0.1 Hz and/or <100 Hz may be filtered out by means of the bandpass. In particular, as a result, the slow changes to the signal and the very rapid changes to the signal may be reliably filtered out. In particular, as a result, a reliable detection of the first actuation type is possible. As a result, the first capacitance value and the corresponding correction value may be reliably determined. Thus a reliable actuation of the operating device is possible.

It has also proved advantageous if a continuous pushing process is identified as a continuous actuation by means of the bandpass and when a continuous pushing process is identified a determination of the correction value is suppressed.

In particular, due to the suppression of the release signal which is too slow by the bandpass a corresponding suppression may be carried out. As a result, an actuation of the operating element and/or also an incorrect actuation of the operating element may be reliably sensed.

It is also advantageous if the first actuation type is detected by means of a comparator unit with a hysteresis of the operating device. In particular, a minimum amplitude is required for switching the comparator unit. In particular, multiple triggering for the correction may be suppressed by means of the comparator unit. As a result, the first actuation type may be detected in a simple and yet reliable manner.

A further feature of the invention relates to an operating device for a household appliance having an operating element, which is actuatable by a first actuation type and a second actuation type, and having a capacitive sensing apparatus, wherein the operating device is configured to perform a method according to the above feature.

Another further feature of the invention relates to a household appliance for preparing food, in particular a gas hob, having an operating device according to the above feature.

Advantageous embodiments of the method are to be regarded as advantageous embodiments of the operating device and of the household appliance. To this end, the operating device and the household appliance have physical features which permit an implementation of the method and/or an advantageous embodiment thereof.

Positions and orientations provided when the component is used as intended and arranged as intended and when an observer is standing, in particular, in front of the component and looking in the direction of the component, are specified by the terms "above", "below", "front", "rear", "horizontal", "vertical", etc.

Further features of the invention are disclosed in the claims, the figures and the description of the figures. The features and combinations of features already cited above in the description, and features and combinations of features cited hereinafter in the description of the figures and/or shown individually in the figures are not only able to be used in the respectively specified combination but also in other combinations or individually without departing from the scope of the invention. Thus embodiments of the invention, which are not explicitly shown and described in the figures but which emerge from and which are able to be generated by separate combinations of features from the described embodiments, are also to be regarded as encompassed and disclosed. Embodiments and combinations of features which, therefore, do not have all of the features of an originally formulated independent claim are also to be regarded as disclosed.

BRIEF DESCRIPTION OF THE DRAWINGS

Exemplary embodiments of the invention are described hereinafter with reference to schematic drawings, in which.

DETAILED DESCRIPTION OF EXEMPLARY EMBODIMENTS OF THE PRESENT INVENTION

Elements which are identical or functionally identical are provided with identical reference characters in the figures.

Figure 1:
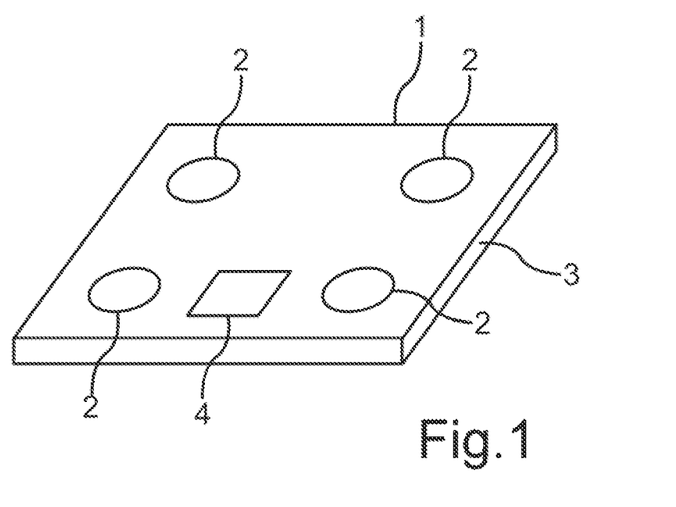
FIG. 1 shows a schematic view of an embodiment of a household appliance.

FIG. 1 shows a schematic perspective view of a household appliance 1. The household appliance 1 is configured in particular as a hob, in particular as a gas hob. The household appliance 1 has at least one cooking zone 2, in the present exemplary embodiment four cooking zones 2, which may be heated up. Moreover, the household appliance 1 has a hob plate 3 which may be made of glass or glass ceramic and which has the cooking zones 2.

The household appliance 1 also has an operating device 4, wherein the cooking zones 2 may be operated and/or controlled by means of the operating device 4. In particular, a heating apparatus, in particular a gas flow of the household appliance 1, may be controlled by means of the operating device.

Figure 2:
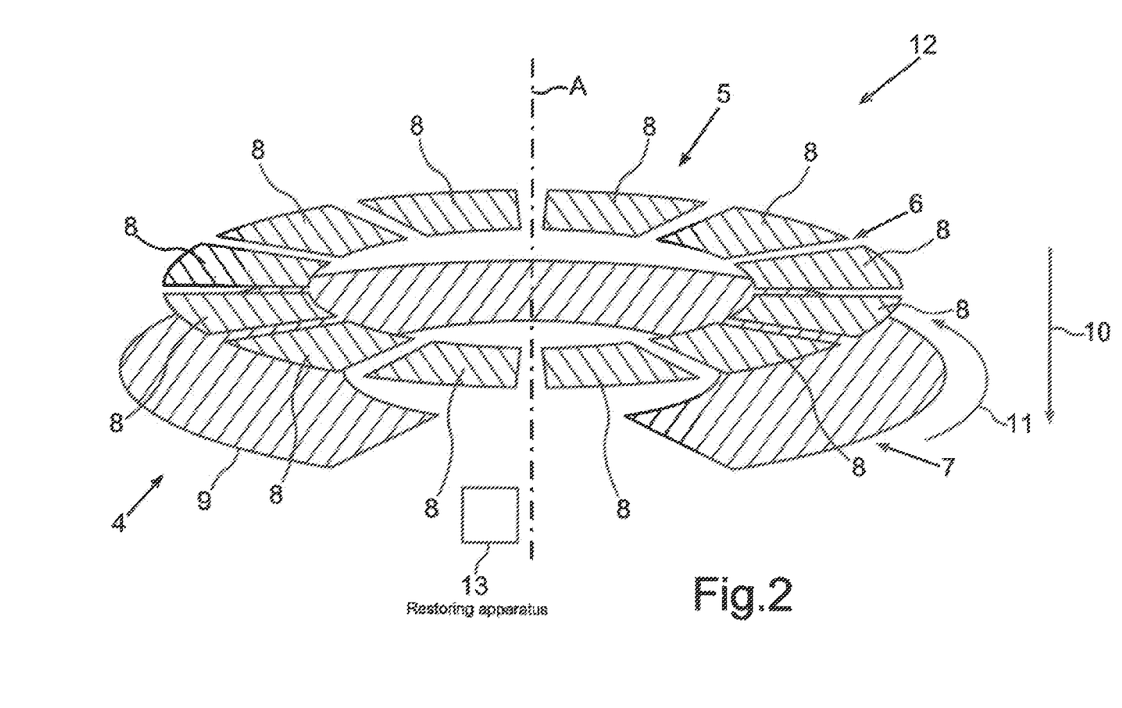
FIG. 2 shows a schematic perspective view of an embodiment of an operating device.

FIG. 2 shows a schematic perspective view of an embodiment of the operating device 4. To this end, the operating device 4 has an operating element 5 which in the present exemplary embodiment may have a stator 6 and a rotor 7. The stator 7 has at least two stator sensor elements 8, in the present exemplary embodiment in particular 12 stator sensor elements 8. The rotor 7 has at least one rotor sensor element 9.

It is provided, in particular, that a first capacitance value 17a and/or a second capacitance value 17b is generated by a positional change of the rotor sensor element 9 relative to the stator sensor elements 8.

It is provided that by means of the operating element 5, a first function of the household appliance 1 is set by actuating the operating element 5 with a first actuation type 10 from a first resting position into a first operating position. For setting a value, a setting parameter of a second function of the household appliance 1 is set by actuating the operating element 5 with a second actuation type 11 which is different from the first actuation type 10, from a second resting position of the operating element into at least one of a plurality of intermediate positions of the operating element 5. In order to actuate the first function of the household appliance 1, at least the first capacitance value 17a of the operating device 5 is sensed by means of a capacitive sensing apparatus 12 of the operating device 4 and, in order to determine the setting parameter, at least the second capacitance value 17b is sensed by means of the capacitive sensing apparatus 12.

It is provided that in the case of the first actuation type 10, from the first resting position into the first operating position, the first capacitance value 17a is sensed and a correction value K is determined in dependence on the sensed first capacitance value 17a, which correction value is taken into account in the determination of the second capacitance value 17b in order to determine the setting parameter of the second function.

Preferably it is provided that the operating device 4 is configured as a burner control knob. In particular, the operating element 5 in the second actuation type 11, in particular when rotated, has a plurality of possible intermediate positions. These intermediate positions may be between the second resting position and an end position relative to the second actuation type 11. The intermediate positions may, in particular, be set steplessly. In particular, the setting parameter is set in a variable manner in the different intermediate positions. For example, in the case of an operating device 5 for a gas hob, the gas flow may be set in a variable manner in the different intermediate positions.

In particular, it is provided that, as the first actuation type 10 of the operating element 5, the operating element 5 is pushed along an axis A of the operating element 5 and, as the second actuation type 11, the operating element 5 is rotated about the axis A.

Moreover, it may be provided, in particular, that after actuating the operating element 5 by means of the first actuation type 10 from the first resting position into the first operating position, the operating element 5 is automatically restored into the first resting position by means of a restoring apparatus 13 of the operating device 4.

Moreover, it may be provided in particular that the actuation of the operating element 5 with the first actuation type 10 takes place chronologically before the actuation of the operating element 5 with the second actuation type 11, and the operating element 5 is actuated with the first actuation type 10 from the same resting position from which the operating element 5 is actuated with the second actuation type 11, so that the first resting position corresponds to the second resting position.

It is provided, in particular, that one respective correction value K is determined for one respective stator sensor element 8 and the respective correction value K of one respective stator sensor element 8 is taken into account when determining the second capacitance value 17b. In particular, a relative angle of the stator 6 to the rotor 7 may be determined in dependence on the second capacitance value 17b and the setting parameter may be set in dependence on the angle.

In particular, it may be provided that the first and the second capacitance value 17b are determined by evaluating stator capacitance values 16 of the at least two stator sensor elements 8. In particular, this may be determined by determining the individual capacitances of the stator sensor elements 8, in particular relative to a grounding of the stator sensor elements 8 and/or by determining coupling capacitances, wherein in this case the stator sensor elements 8 may be sensed relative to one another.

In particular, it may be provided that the first capacitance value 17a is determined by adding up the respective stator capacitance values 16 when actuated with the first actuation type 10.

FIG. 2 also shows that the stator sensor elements 8 and the rotor sensor element 9 are configured, in particular, to be conductive, wherein the stator sensor elements 8, in particular, at least partially cover the rotor sensor element 9. The rotor sensor element 9, in particular, is not galvanically connected to the other components of the operating device 4. In particular, it is provided that the different stator sensor elements 8 are measured as capacitance values 17a, 17b. These capacitance values are, in particular, dependent on the angular position of the rotor 7.

Figure 3:
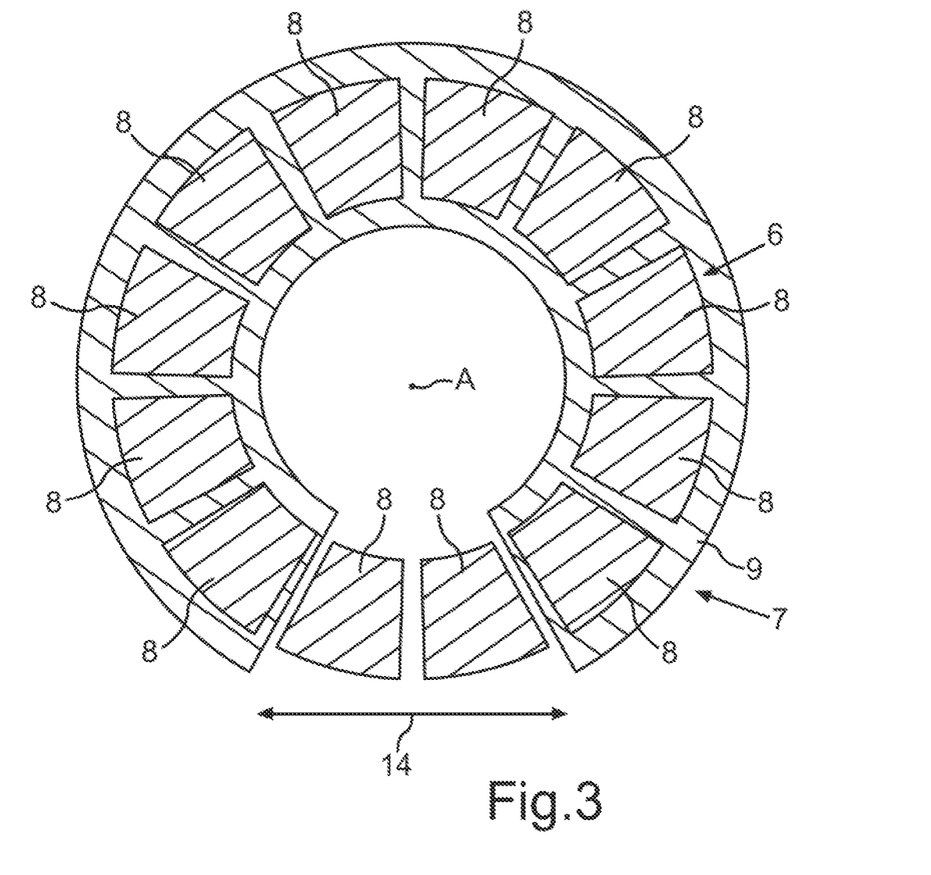
FIG. 3 shows a schematic plan view of an embodiment of an operating device.

FIG. 3 shows in a schematic plan view the operating device 4 according to FIG. 2. In particular, it is shown in FIG. 3 that the stator sensor elements 8 of the stator 7 at least partially cover the rotor sensor element 9 of the rotor 7. In particular, the rotor 7 has an aperture 14 so that a reliable determination of the position of the rotor sensor element 9 relative to the stator sensor elements 8 may be determined.

Figure 4:
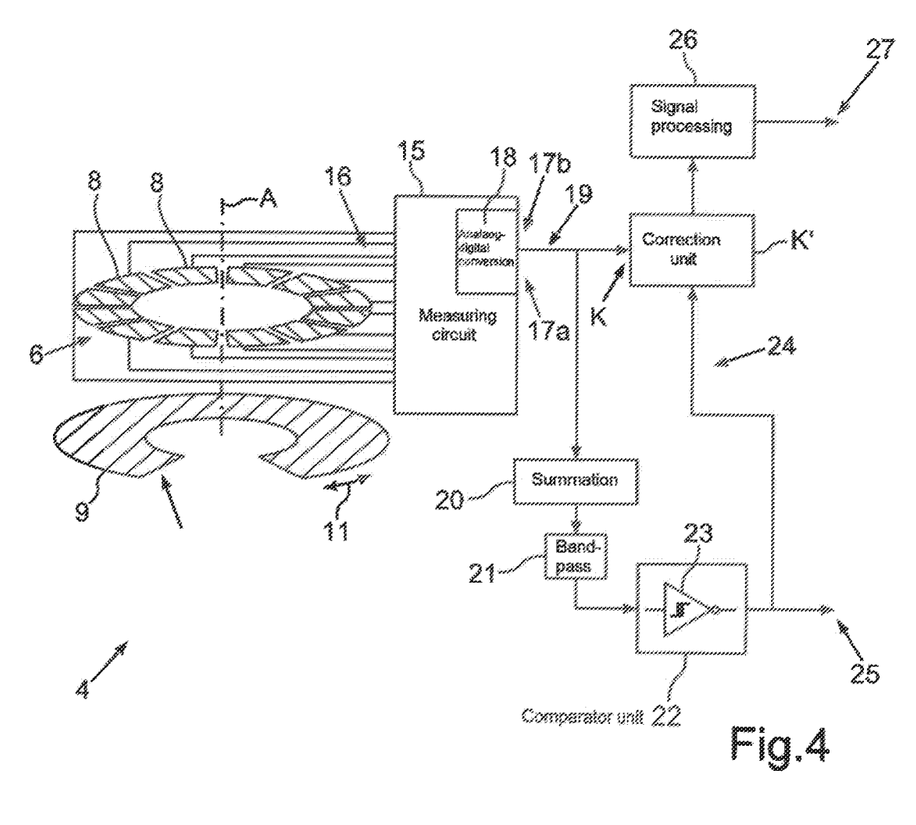
FIG. 4 shows a further schematic view of an embodiment of the operating device.

FIG. 4 shows in a schematic perspective view a further embodiment of the operating device 4. In particular, in FIG. 4 it is shown that stator capacitance values 16 of each stator sensor element 8 are recorded via a measuring circuit 15. In particular, one respective stator signal 19 is generated via an analog-digital conversion 18. In particular, by means of a summator 20 the stator capacitance values 16 may be added up and filtered by means of a bandpass 21. In particular, it is provided that the stator signals 19 of the stator capacitance value change at a frequency of >0.1 Hz and/or <100 Hz are filtered out by means of the bandpass 21. In particular, a continuous pushing process may be identified as a continuous actuation by means of the bandpass 21 and when a continuous pushing process is identified a determination of the correction value K may be suppressed.

Moreover, the operating device 4 has a comparator unit 22 with a hysteresis 23. In particular, the first actuation type 10 may be detected by the comparator unit 22. In particular, a multiple triggering for the correction may be prevented by means of the comparator unit 22 with the hysteresis 23.

In particular, therefore, the correction of the disturbance variables takes place in a correction unit K' which in turn obtains a trigger signal 24 for the correction value calculation. A rotor lift-off signal is generated at an output 25 of the operating device 4. The angular determination is carried out in a signal processing unit 26. The angle is output at an output 27 of the operating device.

In particular, it is provided that by utilizing the characteristic that the operating device 4 is configured as at least one burner control knob, a reliable correction of the capacitance values 17a, 17b may be permitted and thus a reliable calculation of an angle is possible. In particular, in the embodiment of the household appliance 1 as a gas hob, use is made of the fact that at the start of the cooking process the operating element 4 has to be pushed in order to sense the currently valid correction value K. Before the operating element 5 is pushed, an angular sensing is not necessary since at this time the operating element 5 is in any case in the first resting position due to the mechanical construction thereof. The angular sensing is only required after the operating element 5 has been pushed for ignition and then released again. From this point in time, the correction value K of the operating device 4 has to be known in order to be able to determine reliably the capacitance values 17a, 17b and the angle resulting therefrom.

By removing the rotor 7 from the stator 6 during the pushing process, it is possible to determine the capacitance values 17a, 17b of the stator sensor elements 8, during the pushing time as the first actuation type 10, since the influence of the rotor 7 on the capacitance values 17a, 17b during this time is negligibly small. The correction value K of the individual stator sensor element 8, which is required for the subsequent detection of the rotor 7, is calibrated thereby. When the operating element 5 is released the rotor 7 is again positioned on the stator 6, wherein in particular a predefined spacing is formed between the rotor 7 and the stator 6. Subsequently a pure change takes place in the capacitance value due to the presence of the rotor 6 and the angle thereof. This change in the capacitance value is substantially free of disturbance influences and is used for calculating the angle. As a result, the angular determination is reliable and accurate.

The detection of the rotor being lifted off has to occur independently of the correction values K since the detection has to take place before the correction values K are calculated.

In particular, it is provided that the identification of the rotor 7 being lifted off takes place by processing the uncorrected stator signals 19. In this case, initially the sum is formed of all of the measured stator capacitance values 16. This is carried out because the rotor 7 covers a plurality of stator sensor elements 8 and it is not known which stator sensor elements 8 are currently covered. The summation signal subsequently passes through the bandpass 21. The bandpass blocks slow temporal changes to the stator capacitance values 16 which arise, for example, due to drift or due to temperature changes. The bandpass 21 also blocks rapid changes to the signal since these are interference signals, as may arise, for example, by electromagnetic coupling from outside. The bandpass 21 is permeable to changes in signal speeds which are produced by pushing and releasing the operating element 5. In particular, this pushing and releasing is detected by the comparator unit 22 connected downstream. A minimum amplitude is required therein for the switching. The comparator unit 22 has the hysteresis 23 and is designed such that in the case of continuous actuation, for example due to the suppression of a release signal which is too slow through the bandpass 21, it does not deliver a continuously active signal as the rotor lift-off signal 25. In particular, the rotor lift-off signal 25 and the trigger signal 24 are configured identically.

In particular, the operating device 5 has the advantage that a reliable and accurate determination of the rotary knob angle may be carried out with little effort. Moreover, no additional costs are produced in the operating device 5 since the implementation takes place by digital signal processing and no additional components are required.

The invention claimed is:

1. A method for actuating an operating device for a household appliance, said method comprising:
setting by an operating element of the operating device a first function of the household appliance by actuating the operating element with a first actuation type from a first resting position into a first operating position;
setting a setting parameter of a second function of the household appliance by actuating the operating element with a second actuation type which is different from the first actuation type, from a second resting position of the operating element into at least one of a plurality of intermediate positions of the operating element, thereby setting a value;
actuating the first function of the household appliance in response to a sensing of a first capacitance value of the operating device by a capacitive sensing apparatus of the operating device;
establishing a correction value equal to the sensed first capacitance value; and
sensing a second capacitance value with the capacitive sensing apparatus and determining the setting parameter of the second function based on the sensed second capacitance value and the correction value.

2. The method of claim 1, wherein the operating element is pushed along an axis of the operating element in the first actuation type of the operating element, and in the second actuation type, the operating element is rotated about the axis.

3. The method of claim 1, further comprising automatically restoring the operating element into the first resting position by a restoring apparatus of the operating device after actuation of the operating element with the first actuation type from the first resting position into the first operating position.

4. The method of claim 1, wherein the actuation of the operating element with the first actuation type takes place chronologically before the actuation of the operating element with the second actuation type, and wherein the operating element is actuated with the first actuation type from the first resting position which is the same as the second resting position from which the operating element is actuated with the second actuation type so that the first resting position corresponds to the second resting position.

5. The method of claim 1, wherein the capacitive sensing apparatus includes a rotor with a rotor sensor element, and a stator with at least two stator sensor elements, and further comprising generating the first and second capacitance values in dependence on a positional change of the rotor sensor element relative to the at least two stator sensor elements.

6. The method of claim 5, further comprising:
determining for each of the at least two stator sensor elements a stator element correction value, and
determining and/or further processing the second capacitance value by taking into account the stator element correction values of the at least two stator sensor elements.

7. The method of claim 5, further comprising determining a relative angle of the stator to the rotor in dependence on the second capacitance value, wherein the setting parameter is set in dependence on the angle.

8. The method of claim 5, wherein the first and second capacitance values are determined by evaluating stator capacitance values of the at least two stator sensor elements.

9. The method of claim 8, wherein the first capacitance value is determined by adding up the stator capacitance values when actuating the operating element with the first actuation type.

10. The method of claim 8, wherein the first capacitance value is determined by filtering temporal changes to the stator capacitance values as stator signals via a bandpass so as to be able to sense the first actuation type.

11. The method of claim 10, further comprising filtering out with the bandpass the stator signals of stator capacitance value changes at a frequency of less than 0.1 Hz and/or greater than 100 Hz.

12. The method of claim 10, further comprising suppressing the determination of the correction value when the bandpass identifies a continuous pushing process as a continuous actuation.

13. The method of claim 10, wherein the first actuation type is detected by a comparator unit with a hysteresis of the operating device.

14. An operating device for a household appliance, said operating device comprising:
    an operating element configured to set a first function of the household appliance through actuation with a first actuation type from a first resting position into a first operating position and to set a setting parameter of a second function through actuation with a second actuation type which is different from the first actuation type, from a second resting position of the operating element into at least one of a plurality of intermediate positions of the operating element; and
    a capacitive sensing apparatus configured to sense a first capacitance value of the operating device as the operating element is actuated with the first actuation type and to sense a second capacitance value for determining the setting parameter of the second function, the setting parameter of the second function being based on the sensed second capacitance value and a correction value as determined in dependence on equal to the sensed first capacitance value.

15. The operating device of claim 14, wherein the operating element is pushed along an axis of the operating element in the first actuation type of the operating element, and in the second actuation type, the operating element is rotated about the axis.

16. The operating device of claim 14, further comprising a restoring apparatus configured to automatically restore the operating element into the first resting position after actuation of the operating element with the first actuation type from the first resting position into the first operating position.

17. The operating device of claim 14, wherein the operating element is actuated with the first actuation type chronologically before the actuation of the operating element with the second actuation type, said operating element being actuated with the first actuation type from the first resting position which is the same as the second resting position from which the operating element is actuated with the second actuation type so that the first resting position corresponds to the second resting position.

18. The operating device of claim 14, wherein the capacitive sensing apparatus includes a rotor with a rotor sensor element and a stator with at least two stator sensor elements, said capacitive sensing apparatus generating the first and second capacitance values in dependence on a positional change of the rotor sensor element relative to the at least two stator sensor elements.

19. The operating device of claim 18, wherein for each of the at least two stator sensor elements a stator element correction value is determined, and the second capacitance value is determined and/or further processed by taking into account the stator element correction values of the at least two stator sensor elements.

20. The operating device of claim 18, wherein a relative angle of the stator to the rotor is determined in dependence on the second capacitance value, wherein the setting parameter is set in dependence on the angle.

21. The operating device of claim 18, wherein the first and the second capacitance value are determined by evaluating stator capacitance values of the at least two stator sensor elements.

22. The operating device of claim 21, wherein the first capacitance value is determined by adding up the stator capacitance values when actuated with the first actuation type.

23. The operating device of claim 21, further comprising a bandpass configured to determine the first capacitance value by filtering temporal changes to the stator capacitance values as stator signals so as to be able to sense the first actuation type.

24. The operating device of claim 23, wherein the bandpass is configured to filter out the stator signals of stator capacitance value changes at a frequency of less than 0.1 Hz and/or greater than 100 Hz.

25. The operating device of claim 23, wherein the bandpass is configured to identify a continuous pushing process as a continuous actuation and to effect suppression of a determination of the correction value when the bandpass identifies the continuous pushing process as the continuous actuation.

26. The operating device of claim 23, further comprising a comparator unit with a hysteresis of the operating device for detecting the first actuation type.

27. A household appliance for preparing food, in particular a gas hob, said household appliance comprising an operating device as set forth in claim 14.

* * * * *